United States Patent
Lüchinger et al.

(10) Patent No.: US 9,683,111 B2
(45) Date of Patent: Jun. 20, 2017

(54) SOLUTION-PROCESSABLE TUNGSTEN OXIDE BUFFER LAYERS AND ELECTRONICS COMPRISING SAME

(71) Applicant: nanograde AG, Stäfa (CH)

(72) Inventors: Norman Albert Lüchinger, Meilen (CH); Samuel Claude Halim, Zurich (CH)

(73) Assignee: Avantama AG, Stafa (CH)

( * ) Notice: Subject to any disclaimer, the term of this patent is extended or adjusted under 35 U.S.C. 154(b) by 286 days.

(21) Appl. No.: 14/378,631

(22) PCT Filed: Feb. 15, 2013

(86) PCT No.: PCT/CH2013/000032
§ 371 (c)(1),
(2) Date: Aug. 13, 2014

(87) PCT Pub. No.: WO2013/123605
PCT Pub. Date: Aug. 29, 2013

(65) Prior Publication Data
US 2015/0064446 A1 Mar. 5, 2015

(30) Foreign Application Priority Data

Feb. 22, 2012 (EP) .................................... 12001157

(51) Int. Cl.
| | | |
|---|---|---|
| *H01B 1/02* | (2006.01) | |
| *H01B 1/20* | (2006.01) | |
| *B82Y 30/00* | (2011.01) | |
| *C09D 5/24* | (2006.01) | |
| *H01B 1/22* | (2006.01) | |
| *H01L 51/00* | (2006.01) | |
| *H01L 51/50* | (2006.01) | |
| *C01G 41/02* | (2006.01) | |
| *C09D 1/00* | (2006.01) | |
| *C09D 7/00* | (2006.01) | |
| *C09D 11/00* | (2014.01) | |
| *C08K 3/22* | (2006.01) | |
| *C03C 17/00* | (2006.01) | |
| *H01L 21/02* | (2006.01) | |
| *H01L 51/42* | (2006.01) | |

(52) U.S. Cl.
CPC ............... *C09D 5/24* (2013.01); *B82Y 30/00* (2013.01); *C01G 41/02* (2013.01); *C03C 17/007* (2013.01); *C08K 3/22* (2013.01); *C09D 1/00* (2013.01); *C09D 7/001* (2013.01); *C09D 11/00* (2013.01); *H01B 1/22* (2013.01); *H01L 51/00* (2013.01); *H01L 51/4213* (2013.01); *H01L 51/5088* (2013.01); *C01P 2004/64* (2013.01); *C03C 2217/219* (2013.01); *C03C 2217/42* (2013.01); *C08K 2003/2258* (2013.01); *H01L 21/02565* (2013.01); *H01L 21/02573* (2013.01); *H01L 21/02581* (2013.01); *H01L 21/02601* (2013.01); *H01L 21/02628* (2013.01); *H01L 51/42* (2013.01); *H01L 51/5068* (2013.01); *H01L 2251/303* (2013.01); *H01L 2251/5369* (2013.01); *Y02E 10/549* (2013.01); *Y02P 70/521* (2015.11); *Y10T 428/256* (2015.01)

(58) Field of Classification Search
CPC ... H01B 1/02; H01B 1/20; H01B 1/22; H01B 1/22; B82Y 30/00
See application file for complete search history.

(56) References Cited

U.S. PATENT DOCUMENTS

| | | | | |
|---|---|---|---|---|
| 5,165,992 A * | 11/1992 | Yajima | ................... | C03C 17/007 428/323 |
| 5,366,545 A * | 11/1994 | Yajima | ..................... | C08K 3/22 106/286.4 |
| 5,472,797 A * | 12/1995 | Yajima | ................... | G02B 1/105 106/286.4 |
| 6,010,778 A * | 1/2000 | Kimura | ..................... | C08J 7/047 351/159.01 |
| 7,708,974 B2 * | 5/2010 | Yadav | .................... | B82Y 30/00 250/462.1 |
| 2007/0290604 A1 | 12/2007 | Sakanoue et al. | | |
| 2011/0212832 A1 | 9/2011 | Nakano et al. | | |
| 2011/0317239 A1 | 12/2011 | Mori et al. | | |
| 2013/0126848 A1 | 5/2013 | Harada et al. | | |

FOREIGN PATENT DOCUMENTS

| | | |
|---|---|---|
| EP | 2 360 220 A1 | 8/2011 |
| JP | 2003-334430 A | 11/2003 |
| JP | 2009-277601 A | 11/2009 |
| WO | 2007/094019 A1 | 8/2007 |
| WO | 2012/017502 A1 | 9/2012 |

OTHER PUBLICATIONS

International Search Report for corresponding International Application No. PCT/CH2013/000032 mailed Apr. 29, 2013.
Meyer et al., "Transparent Inverted Organic Light-Emitting Diodes with a Tungsten Oxide Buffer Layer", Advanced Materials, vol. 20, 2008, pp. 3839-3843.
Meyer et al., "MoO3 Films Spin-Coated from a Nanoparticle Suspension for Efficient Hole-Injection in Organic Electronics", Advanced Materials, vol. 23, 2011, pp. 70-73.
Stubhan et al., "High shunt resistance in polymer solar cells comprising a MoO3 hole extraction layer processed from nanoparticle suspension", Applied Physics Letters, vol. 98, 2011, pp. 253308-1 to 253308-3.

(Continued)

*Primary Examiner* — Khanh Tuan Nguyen
*Assistant Examiner* — Haidung Nguyen
(74) *Attorney, Agent, or Firm* — Renner, Otto, Boisselle & Sklar, LLP

(57) ABSTRACT

The present invention relates to the field of organic electronics, such as OLEDs, OPVs and organic photo detectors. It particularly provides intermediates and materials suitable for manufacturing such organic electronics, to specific manufacturing methods and to specific uses.

8 Claims, 2 Drawing Sheets

(56) References Cited

OTHER PUBLICATIONS

Figure 1:
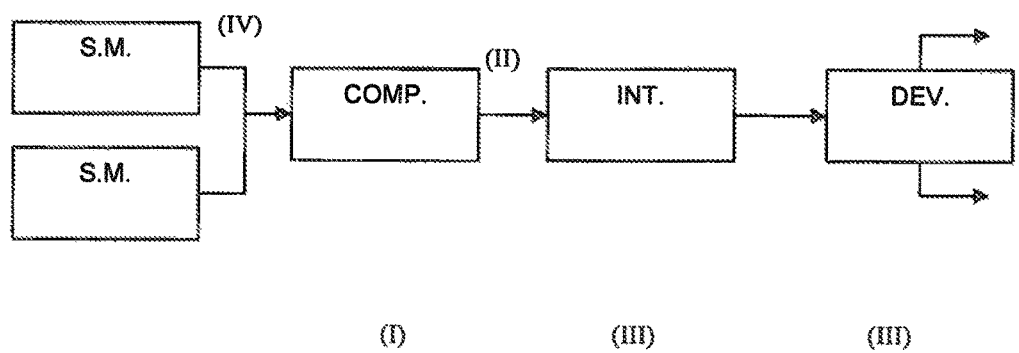

English translation of the details an Office Action in corresponding Japanese Application No. 2014-0557955 dated Dec. 2016.

\* cited by examiner

SOLUTION-PROCESSABLE TUNGSTEN OXIDE BUFFER LAYERS AND ELECTRONICS COMPRISING SAME

This application is a national phase of International Application No. PCT/CH2011/000032 filed Feb. 15, 2013 and published in the English language, which claims priority to Application No. EP 12001157.2 filed Feb. 22, 2012.

The present invention relates to the field of organic electronics, such as OLEDs and OPVs. It particularly provides intermediates and materials suitable for manufacturing such organic electronics, to specific manufacturing methods and to specific uses.

It is known to use buffer layers in organic electronics, such as organic light emitting diodes (OLED) or organic photovoltaic cells (OPV), in order to increase device efficiency. These layers typically have a thickness below 100 nm to retain optical transparency and a low serial resistance. Such layers may comprise $WO_3$ and/or $MoO_3$, which exhibit remarkably deep lying electronic states and are strongly n-doped by oxygen vacancies. Meyer et al. (Adv. Mater. 2008, 20, 3839-3843) disclose efficient hole-injection into organic materials with deep-lying HOMO levels from an ITO electrode covered with a $MoO_3$ or $WO_3$ hole injection layer (HIL) (also called hole transport layer (HTL)). Simplified device structures consisting only of one or two organic layers can therefore be realized. $MoO_3$ and $WO_3$ hole injection layers mentioned above are typically manufactured by thermal evaporation under high vacuum; which is disadvantageous in terms of low-cost, large-area manufacturing processing.

Meyer et al. (Adv. Mater., Ger. 23, 70 2011) and Stubhan et al. (Appl. Phys. Lett. 98, 253308 2011) disclose suspensions comprising $MoO_3$ nanoparticles useful for the solution processing of $MoO_3$ HIL layers in organic electronics. Both documents are silent about the coating type. However, the processes disclosed therein are considered disadvantageous. First, as the solvent (xylene) can damage active organic layers in OLEDs or OPVs. Therefore, applications of the suspensions disclosed therein are limited to inorganic functional layers. Second, as a polymeric dispersing agent is used for the particle stabilization. Upon application of the suspension and drying-off the xylene, the dispersing agent remains in deposited $MoO_3$ layers. This non-volatile organic material has a negative impact on the electronic properties of the HIL layer because all the inorganic HIL nanoparticles are covered with an electrically insulating organic shell. Therefore, an additional cleaning treatment by temperature annealing (>300° C.) or a plasma treatment (e.g. ozone plasma) is required which can damage organic functional layers and substrates.

Nakano et al. (US2011212832) describe water based $WO_3$ dispersions. Due to the fact that $WO_3$ exhibits an isoelectric point at about pH 1, the $WO_3$ particles are negatively charged at pH 7 in water resulting in electrostatic particle stabilization. However, such dispersions are of limited use, as they cannot be applied on hydrophobic substrates such as organic active layers, particularly due to the bad wettability of aqueous systems on such substrates. Further, Nakano et al. discuss addition of ethanol (up to 20 wt %) but find this embodiment disadvantageous due to aggregation and stability problems.

Angiuli et al. (WO2007094019) describe colloidal solutions of tungsten oxide obtained by sol-gel methods and their application for the fabrication of thick $WO_3$ films used in thermochromic films. They achieve enhanced film formation on inorganic substrates by the use of an organic thickener (polyethylene glycol) and organic surfactants. Such $WO_3$ colloidal solutions are disadvantageous since the organic additives (thickener and surfactants) have a highly negative influence on the electronic properties of deposited $WO_3$ films.

Tofonuko et al. (EP2360220) describe infrared blocking particle dispersions. The particles disclosed therein have a diameter in the range of 1-800 nm and are of tungsten oxide coated with tetrafunctional silanes, its hydrolysis product and/or organic metal compounds. The document is silent about the use in OPVs or OLEDs; it also does not disclose or discuss uncoated tungsten oxide (i.e. nanoparticles having a tungsten oxide surface).

Harada et al. (WO2012/017502) disclose organic electroluminescence elements and methods of manufacturing such elements. These elements comprise an HEL layer (4) or tungsten oxide. However, this layer is manufactured in a different process when compared to the present invention, at least because it does not disclose the suspensions of the present invention.

Thus, it is an object of the present invention to mitigate at least some of these drawbacks of the state of the art. In particular, it is an aim of the present invention to provide compositions suitable for thin film formation on a plurality of substrates. It is a further aim to provide manufacturing methods for thin films avoiding vapor phase processes.

These objectives are achieved by a composition as defined in claim 1 and a method of claim 7. Further aspects of the invention are disclosed in the specification and independent claims, preferred embodiments are disclosed in the specification and the dependent claims.

The present invention will be described in detail below. It is understood that the various embodiments, preferences and ranges as provided/disclosed in this specification may be combined at will. Further, depending of the specific embodiment, selected definitions, embodiments or ranges may not apply. The terms "a", "an," "the" and similar terms used in the context of the present invention are to be construed to cover both the singular and plural unless otherwise indicated herein or clearly contradicted by the context. Further, the terms "including", "containing" and "comprising" are used herein in their open, non-limiting sense. The term "containing" shall include both, "comprising" and "consisting of".

Unless otherwise stated, the following definitions shall apply in this specification:

Percentages are given as weight-%, unless otherwise indicated herein or clearly contradicted by the context.

The term "azeotrope" is known in the field and describes mixtures of two or more liquids where the liquid phase and its vapor phase have the same ratio of constituents when boiling. The term includes both positive and negative azeotropes, binary and multiple azeotropes, as well as homogeneous and heterogeneous azeotropes.

Positive/negative azeotropes: Each azeotrope has a characteristic boiling point. The boiling point temperature of an azeotrope is either lower than the boiling point temperatures of any of its constituents (a positive azeotrope), or higher than the boiling point temperatures of any of its constituents (a negative azeotrope). In general, a positive azeotrope boils at a lower temperature than any other ratio of its constituents. Positive azeotropes are also called minimum boiling mixtures or pressure maximum azeotropes. A well known example of a positive azeotrope is 95.6% ethanol and 4.4% water (by weight). At atmospheric pressure ethanol boils at 78.4° C., water boils at 100° C., but the azeotrope boils at 78.2° C., which is lower than either of its constituents. Indeed 78.2° C. is the minimum temperature at which any ethanol/water solution can boil at atmospheric pressure. Preferred are positive azeotropes.

Heterogeneous/homogeneous azeotropes: If the constituents of a mixture are not completely miscible the azeotropic composition can be found inside the miscibility gap. This type of azeotrope is called heterogeneous azeotrope. If the azeotropic composition is outside the miscibility gap or the constituents of the mixture are completely miscible the type of azeotrope is called a homogeneous azeotrope. A heterogeneous azeotrope typically is indicated by three different azeotropic compositions including an average, an upper and a lower azeotropic composition. For example, at ambient conditions 1-butanol forms a heterogeneous azeotrope with water, having an average azeotropic composition of 44.5 wt % water, an upper azeotropic composition of 20.1 wt % water and a lower azeotropic composition of 92.3 wt % water. The average azeotropic composition of 44.5 wt % water is found in the miscibility gap of the 1-butanol/water system. The upper and lower azeotropic compositions are outside of the miscibility gap, forming homogeneous mixtures. In the present invention the term azeotropic composition relates either to azeotropic compositions of homo-azeotropes (homogeneous azeotropes) or upper azeotropic compositions of hetero-azeotropes (heterogeneous azeotropes). Lower azeotropic compositions of hetero-azeotropes are considered unsuitable because the amount of water is larger than the total amount of organic solvent leading to limited suspension stability and high surface tension (=low wettability).

The term "aqueous azeotropes" is known in the field and includes azeotropes where one component is water.

The term "azeotropic water content" (a.c.) denotes the mass of water in a defined amount of a binary azeotropic composition (water content at the azeotropic point (a.p.)). For example, the azeotropic water content corresponding to 100 g of ethanol is 4.6 g because the azeotropic point is at 4.4 wt % water for the binary ethanol/water system. In the context of this invention the term azeotropic water content is limited to one single organic solvent, regardless of the presence of another organic solvent. Two different organic solvents present in a homogeneous solvent composition therefore result in two different azeotropic watercontents (one for each solvent).

The term "total azeotropic water content" (t.a.c.) denotes the sum of all azeotropic water contents in a solvent composition. For example, a solvent composition comprising 50 g of ethanol (azeotropic point=4,4 wt %) and 50 g of iso-propanol (azeotropic point=12.1 wt %) results in a total azeotropic water content of 9.2 g water (see example 1 in the table below). In binary solvent compositions (water and one solvent), the azeotropic water content=total azeotropic water content.

The following equation shows the determination of the total azeotropic water content (t.a.c.) of a solvent composition with multiple organic solvents S1 and S2 (each able to form an azeotrope with water):

$$t.a.c = \left(\frac{s.c.(S1)}{\left(\frac{100-a.p.(S1)}{100}\right)} - s.c.(S1)\right) + \left(\frac{s.c.(S2)}{\left(\frac{100-a.p.(S2)}{100}\right)} - s.c.(S2)\right) + \ldots$$

or simplified $$t.a.c. = \left(\frac{s.c.(S1) \cdot a.p.(S1)}{100 - a.p.(S1)}\right) + \left(\frac{s.c.(S2) \cdot a.p.(S2)}{100 - a.p.(S2)}\right) + \ldots$$

whereby
S1 is an organic solvent 1
S2 is an organic solvent 2
s.c. is the amount of organic solvent,
a.p. is the azeotropic point (in wt %).

Organic solvents, not forming an azeotrope with water, result in an azeotropic water content of zero.

TABLE 1

Examples for the determination of the total azeotropic water content in a solvent composition comprising two different solvents.

| organic Solvent (S) | amount of organic solvent (s.c.) | azeotropic point (a.p.) | azeotropic water content (a.c.) |
|---|---|---|---|
| Ethanol (S1) | 50 g | 4.4 wt % water | 2.3 g water |
| Isopropanol (S2) | 50 g | 12.1 wt % water | 6.9 g water |
| | | Total azeotrophic water content (t.a.c.) = | 9.2 g water |
| Ethanol (S1) | 90 g | 4.4 wt % water | 4.1 g water |
| Isopropanol (S2) | 10 g | 12.1 wt % water | 1.3 g water |
| | | Total azeotrophic water content (t.a.c.) = | 5.4 g water |
| Ethanol (S1) | 50 g | 4.4 wt % water | 2.3 g water |
| Acetone (S2) | 50 g | No azeotrope | 0 g water |
| | | Total azeotrophic water content (t.a.c.) = | 2.3 g water |

The term "organic solvent" is known in he field and particularly includes alcohols, nitriles, ketones, esters, ethers, aldehydes. Except for alcohols, the above derivatives are preferably non-substituted. Alcohols may be partly or fully substituted with halogen. Alcohols may be partly substituted with alkoxy. Alcohols may also contain multiple bonds. The above derivatives include linear, branched and cyclic derivatives. The above derivatives typically have 1-12 carbon atoms, preferably 1-5 carbon atoms.

The term "amount of organic solvent" denotes the mass of a specific organic solvent present in a solvent composition (i.e. 10 g (ethanol)).

The term "total amount of organic solvent" denotes the weight-based sum of all portions of organic solvents in a given amount of a final composition (i.e. 50 g (i.e. 10 g ethanol+40 g 1-propanol)).

The term "amount of water" denotes the weight-based total portion of water in a given amount of a final composition (i.e. 50 g (water)).

The terms "surfactant", "dispersant" and "dispersing agent" are known in the field and have essentially the same meaning. In the context of the present invention, these terms denote an organic substance, other than a solvent, which is used in suspensions or colloids to improve the separation of particles and to prevent agglomeration or settling. Surfactants, dispersants and dispersing agents can be polymers or small molecules and typically contain functional groups. Surfactants, dispersants and dispersing agents are physically or chemically attached on the particle surface either before or after adding the particles to the external phase. In the context of the present invention, water and organic solvent molecules (e.g. ethanol, methanol or isopropanol) are not considered surfactants, dispersants or dispersing agents.

The present invention will be better understood by reference to the figures.

FIG. 1 shows a schematic set-up of the invention. In summary, the invention describes specific compositions containing tungsten oxide (COMP, $1^{st}$ aspect of the invention, denoted (I)) which enable the solution deposition of tungsten oxide nanoparticle layers on substrates (INT, $2^{nd}$ aspect of the invention; (II)). The obtained thin films show a low residual organic content after drying under moderate conditions ($3^{rd}$ aspect). These layers are useful in the manufacturing of organic electronics (DEV). The above compositions are obtainable as described in the $4^{th}$ aspect of the invention (IV) by the use of known starting materials (S.M.)

Figure 2:
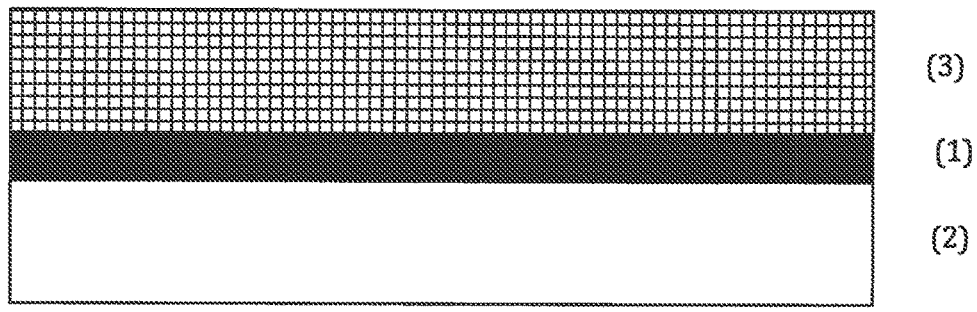

FIG. 2 shows the essential layers of an intermediate product (INT), useful for the manufacturing of organic electronics, wherein (1) is the tungsten oxide hole transport layer, (2) is an organic active layer (e.g. a polymeric active layer or a small-molecule active layer) and (3) is an electrode or a second organic active layer. The electrode can be transparent or non-transparent. Typically, the three depicted layers are only part of a more complex layer architecture forming an intermediate product; underneath or on top of the depicted layers can be different layers, such as a supporting substrate, and/or an electron transport layer and/or a second electrode.

Figure 3:
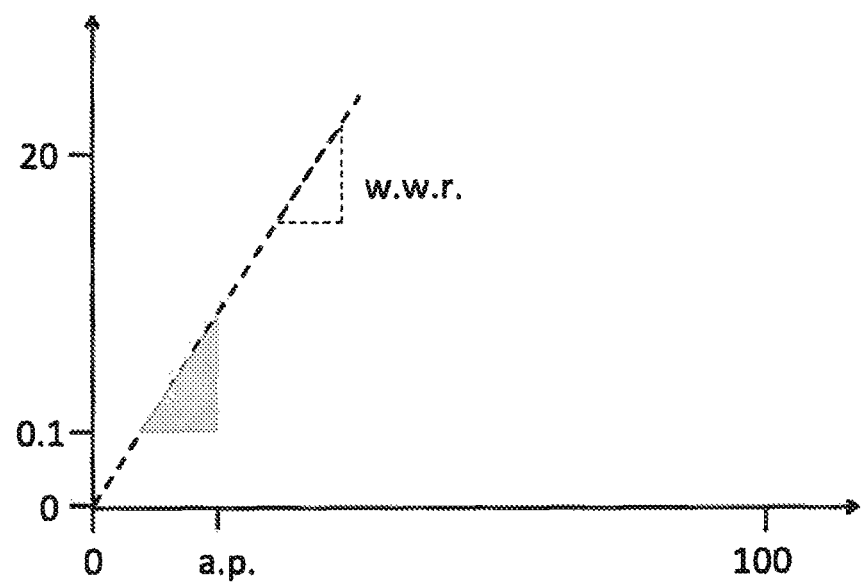

FIG. 3 shows a schematic illustration for an inventive suspension composition comprising tungsten oxide, organic solvent and water. The x-axis denotes the amount of water (wt-%), the azeotropic point (a.p.) is noted. The y-axis denotes the amount of nanoparticles (wt-%), preferred upper and lower limits are indicated. The dashed line indicates the ratio amount of nanoparticles:amount of water (w.w.r.=amount of nanoparticles:amount of water ratio (w/w). Accordingly, in an inventive composition the amount of water is below the azeotropic water/organic solvent composition and the ratio of nanoparticles/water is within the indicated range. The grey area indicates inventive compositions; Such compositions show improved stability, wettability and film formation.

Figure 4:
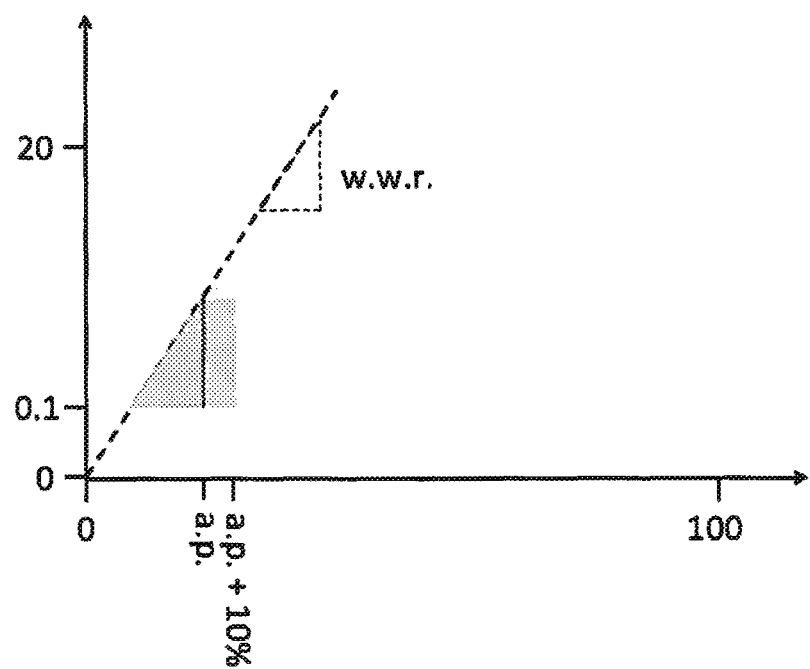

FIG. 4 shows a schematic illustration for an alternative inventive suspension composition comprising tungsten oxide, organic solvent and water. The x-axis denotes the amount of water (wt-%), which may be up to 10% above the azeotropic point, the azeotropic point (a.p.) is noted. The y-axis denotes the amount of nanoparticles (wt-%), preferred upper and lower limits are indicated. The dashed line indicates the ratio amount of nanoparticles: amount of water (w.w.r.=amount of nanoparticles:amount of water ratio (w/w). Accordingly, in an inventive composition the amount of water is up to 10 wt % above the azeotropic water/organic solvent composition and the ratio of nanoparticles/water is within the indicated range. The grey area indicates inventive compositions. Such compositions also show improved stability, wettability and film formation.

In more general terms, in a first aspect, the invention relates to a composition in the form of a suspension, said composition containing (a) tungsten oxide nanoparticles as described below, and (b) a homogeneous solvent composition as described below as type (A), (B) and (C). In each of these types, the homogeneous solvent composition contains water. Without being bound to theory, it is believed water stabilizes the nanoparticles (a) and thus facilitates the further processing.

The compositions described herein as type (A), (B) and (C) and (D) have beneficial properties and have advantageous uses as outlined below. It was found that the inventive compositions (i) show good wettability on both hydrophobic substrates (such as organic functional layers) and hydrophilic substrates (such as ITO, glass); and/or (ii) are compatible with organic materials, particularly no swelling or dissolution of organic materials is observed; and/or (iii) show a high shelf-life (superior suspension stability); and/or (iv) show homogeneous film formation on hydrophobic and hydrophilic substrates.

This aspect of the invention shall be explained in further detail below.

The term suspension is known and relates to a heterogeneous fluid of an internal phase (i.p.) that is a solid and an external phase (e.p.) that is a liquid. In the context of the present invention, a suspension typically has a kinetic stability of at least 1 day (measured according to complete particle sedimentation). In an advantageous embodiment, the invention provides for a composition with (hydrodynamic size $D_{90}$ of less than 100 nm) a shelf-life of more than 7 days, particularly more than 2 months.

Tungsten oxide nanoparticles include (i) nanoparticles of pure tungsten oxide, (ii) nanoparticles of doped tungsten oxide and (iii) core shell nanoparticles, whereby the shell is composed of tungsten oxide or doped tungsten oxide and whereby the core is composed of a different inorganic material.

The term nanoparticle is known and particularly relates to solid amorphous or crystalline particles having at least one dimension in the size range of 1-100 nm. Preferably, nanoparticles are approximately isometric (such as spherical or cubic nanoparticles). Particles are considered approximately isometric, in case the aspect ratio (longest: shortest direction) of all 3 orthogonal dimensions is 1-2.

In an advantageous embodiment, the nanoparticles have a mean primary particle size of 2-60 nm, preferably 5-30 nm (measured by transmission electron microscopy).

In a further advantageous embodiment, the nanoparticles in suspension have a hydrodynamic size $D_{90}$ of less than 100 nm (measured by dynamic light scattering or centrifugal sedimentation techniques).

In a further advantageous embodiment, the nanoparticles are synthesized by a gas phase process, preferably flame spray synthesis. Without being bound to theory, it is believed that the microstructure of such nanoparticles differs from the microstructure of particles synthesized e.g. by precipitation processes or by sublimation processes. Compositions as described herein and comprising particles made by gas phase processes are particularly stable and suitable in the applications described below.

The amount of nanoparticles in the inventive composition may—depending on the intended use—vary over a broad range, but typically is in the range of 0.1-20 wt % (preferably 0.1-10 wt %, particularly preferably 1-5 wt %) of the composition. In order to deposit tungsten oxide nanoparticle films with a dry thickness below 200 nm by large-scale processes (such as roll-to-roll coating, spray coating, dip coating, ink-jet printing, reel-to-reel coating, pad printing, offset printing, screen printing, sheet-to-sheet printing, slot-die coating or blade coating), the nanoparticle solid content of the corresponding composition should be comparatively low. Without being bound to theory, this is due to the fact that the application of the suspension results in a minimal wet film thickness which is difficult to minimize further. By reducing the amount of nanoparticles in the composition, the final nanoparticulate film thickness can be reduced to small values well below 100 nm.

The term water is known and particularly relates to purified water, such as de-ionized or distilled water.

The amount of water in the inventive composition may—depending on the intended use—vary over a broad range, but typically is in the range of 0.1-20 wt %, especially 0.5-10 wt % of the composition. It was surprisingly found that this low amount of water is sufficient for stabilizing the nanoparticles.

Specifically, it was found that the suspension stability is very high if all the water present in a formulation forms an azeotropic interaction with a solvent. In other words, the suspension stability is high if the amount of water is below the azeotropic composition for a water/solvent system. For example, in a formulation containing ethanol and water, the amount of water should be below 4.4 wt % (azeotropic point of water in ethanol) with respect to ethanol (see FIG. 3).

It was further found that the suspension stability is high if the amount of water exceeds the azeotropic composition for a water/solvent system up to 10% wt-%. For example, in a formulation containing isopropanol and water, the amount of water should be below 13.3 wt % (azeotropic point of water in isopropanol=12.1 wt %).

It was also found that the presence of water improves stability. Good results are obtained in case the ratio amount nanoparticles:amount of water is below 9:1 (w/w), preferably below 1.5:1. Values larger than 9:1 result in a low suspension stability, this is indicated by the dashed line in FIG. 3.

Type (A): In this embodiment, said homogeneous solvent composition contains, preferably consists of, (i) water; (ii) a first organic solvent forming a binary azeotrope with water; whereby the amount of water in said solvent composition (b) is below the total azeotropic water content with respect to said first organic solvent, and whereby the ratio amount of nanoparticles:amount of water is below 9:1 (w/w), preferably below 1.5:1.

Thus, the homogeneous solvent composition (b) is chosen to contain water in such an amount that after azeotropic evaporation of the water, organic solvent remains.

In a preferred embodiment, the amount of water in said solvent composition (b) is lower than the total amount of organic solvent. By this embodiment, in case of hetereogeneous azeotropes, the composition is in the "upper region". Further, by this embodiment, the surface tension shows beneficial properties.

In a preferred embodiment, said first solvent is selected from the group consisting of alcohols, and nitriles.

In a particularly preferred embodiment, said first solvent has a formula (I)

R—OH (I)

where R represents a linear or branched, non-substituted alkyl chain having 2-5 carbon atoms, preferably 2-4 carbon atoms, most preferably 2-3 carbon atoms.

In a very particularly preferred embodiment, said first solvent is selected from the group consisting of Ethanol, 1-Propanol, 2-Propanol, 1-Butanol, 2-Butanol, iso-Butanol, tert-Butanol, acetonitrile, propionitrile.

In a preferred embodiment, said homogeneous solvent composition of type (A) consists of water and a first organic solvent forming a positive azeotrope with water.

Type (B): In this embodiment, said homogeneous solvent composition contains, preferably consists of, (i) water; (ii) a first organic solvent forming a binary azeotrope with water; (iii) additionally a second organic solvent forming a binary azeotrope with water, whereby the amount of water in said solvent composition (b) is below the total azeotropic water content with respect to said first and said second organic solvent and whereby the ratio amount of nanoparticles:amount of water is below 9:1 (w/w), preferably below 1.5:1.

Thus, the homogeneous solvent composition (b) is chosen to contain water in such an amount that after azeotropic evaporation of the water, organic solvent remains.

In a preferred embodiment, the amount of water in said solvent composition (b) is lower than the total amount of organic solvent. By this embodiment, in case of hetereogeneous azeotropes, the composition is in the "upper region". Further, by this embodiment, the surface tension shows beneficial properties.

In a preferred embodiment, said second solvent is selected from the group consisting of alcohols, nitriles, ketones, esters, ethers, aldehydes and alkoxy-alcohols.

In a preferred embodiment, alkoxy-alcohols have a formula (II)

where R1 and R2 represent a linear or branched alkyl chain having 1 to 6 carbon atoms each and where the total number of carbon atoms is between 3 and 7.

Type (C): In this embodiment, said homogeneous solvent composition contains, preferably consists of, (i) water; (ii) the first and optionally the second organic solvent (both as defined herein); and (iii) a third organic solvent not forming a binary azeotrope with water, whereby the amount of water in said solvent composition (b) is lower than the total amount of organic solvent and whereby the ratio amount of nanoparticles: amount of water is smaller than 9:1 (w/w) (preferably smaller than 1.5:1).

Thus, the homogeneous solvent composition (b) is chosen to contain water in such an amount that after azeotropic evaporation of the water, organic solvent remains.

In a preferred embodiment, the amount of water in said solvent composition (b) is lower than the total amount of organic solvent. By this embodiment, in case of hetereogeneous azeotropes, the composition is in the "upper region". Further, by this embodiment, the surface tension shows beneficial properties.

In a preferred embodiment, said third solvent is selected from the group consisting of alcohols, nitriles, ketones, esters, ethers, aldehydes and alkoxy-alcohols.

In a preferred embodiment, alkoxy-alcohols have a formula (II) as defined above.

Type (D): In this embodiment, said homogeneous solvent composition contains, preferably consists of, a composition as described in (A), (B), or (C) whereby the amount of water in said solvent composition (b) is up to 10% above the total azeotropic water content with respect to said first organic solvent.

It is understood that the homogeneous solvent composition of type (A), (B), (C) or D may additionally contain one or more further organic solvents Thus, the homogeneous solvent compositions either consist of the components as described above or comprise these components and, for example, one further organic solvent.

In an advantageous embodiment, the invention provides a composition in the form of a suspension as defined herein, wherein the amount of water<total azeotropic water content; and the ratio of amount of nanoparticles:amount of water<9:1; and the amount of nanoparticles in the total composition is in the range of 0.1-20 wt %. Suitable examples for inventive compositions are outlined in the table below:

TABLE 2

| nano-particles wt % | Water wt % | $1^{st}$ solvent wt % | $2^{nd}$ solvent wt % |
|---|---|---|---|
| 0.2-4 | 0.2-4 | 92-99.6 ethanol | |
| 0.2-10 | 0.2-10 | 80-99.6 2-propanol | |
| 0.2-20 | 0.2-20 | 60-99.6 1-propanol | |
| 0.2-16 | 0.2-16 | 68-99.6 1-butanol | |
| 0.2-20 | 0.2-20 | 60-99.6 2-butanol | |
| 0.2-10 | 0.2-10 | 80-99.6 tert-butanol | |
| 0.2-13 | 0.2-13 | 74-99.6 acetonitrile | |
| 0.2-4 | 0.2-4 | 92-99.6 propionitrile | |
| 0.2-10 | 0.2-10 | 0.6-80 1-propanol | 0.5-99 methanol |
| 0.2-4 | 0.2-4.5 | 91.5-99.6 ethanol | |

In an advantageous embodiment, the suspension of the present invention (i.e. for types (A) to (D)) is free of, or essentially free of, surfactants and dispersing agents.

In an advantageous embodiment, the invention provides a composition as described herein (i.e. for types (A) to (D)) resulting in a residual organic carbon content of less than 2.5 wt %, particularly less than 1 wt %, this value being obtained after drying for 1 h at 150° C. after application by solution processing (e.g. roll-to-roll-coating or slot-die coating).

In an advantageous embodiment, the invention provides a composition as described herein (i.e. for types (A) to (D)) wherein the amount of homogeneous solvent composition is in the range of 80-99.9 wt %, preferably 90-99.9 wt %.

In an advantageous embodiment, the invention provides a composition as described herein (i.e. for types (A) to (D)) wherein said first solvent and/or said second solvent has a boiling point below 150° C.

In an advantageous embodiment, the invention provides a composition as described herein (i.e. for types (A) to (D)) wherein said first solvent and/or said second solvent has a surface tension below 30 mN/m.

In one embodiment, the invention provides a composition as described herein (i.e. for types (A) to (D)) wherein said nanoparticles consist of tungsten oxide having the chemical composition $WO_x$ ("pure tungsten oxide"). The term "pure tungsten oxide" relates to compositions with the formula $WO_x$, whereby x typically is 2-3.

In a further embodiment, the invention provides a composition as described herein (i.e. for types (A) to (D)) wherein said $WO_x$ nanoparticles are doped with 0.001-30 wt %, preferably 0.01-10 wt %, most preferably 0.01-5 wt % (with respect to W), by one or more metals ("doped tungsten oxide"). The term "doped tungsten oxide" relates to compositions of $WO_x$ where tungsten (W) is substituted by one or more metals (="dopants"). The dopant atoms are incorporated into the $WO_x$ crystal lattice either substitutionally or interstitially forming a homogeneous single-phase (a "solid solution").

In the context of the present invention, separated multi-phase systems (e.g. $WO_x+Fe_2O_3$) are not considered doped tungsten oxide.

In a preferred embodiment, said dopant atoms are selected from the group consisting of transition metals or alkaline or earth-alkaline metals.

Doping of tungsten oxide can enable the fine tuning of the properties of the inventive thin films, such as electrical conductivity and/or optical absorbance.

In a further embodiment, the invention provides a composition as described herein (i.e. for types (A), (B) and (C) and (D)) wherein said tungsten oxide nanoparticles are core-shell nanoparticles having a core-shell architecture. In this embodiment, the shell is composed of tungsten oxide or doped tungsten oxide. The thickness of the shell typically is between a monolayer and 20 nm of tungsten oxide, preferably between 1 nm and 10 nm tungsten oxide. Deposition of tungsten oxide shells includes techniques such as atomic layer deposition or sol-gel methods. In this embodiment, the core is composed of an inorganic material different from the shell. Suitable core materials are metal-oxides.

The invention further provides for various uses of the inventive compositions. These include: (a) the use of tungsten oxide nanoparticle films as a hole transport layer in organic solar cells or in organic light emitting diodes or in organic photo detectors; (b) the use of tungsten oxide nanoparticle films in photochromic applications; (c) the use of tungsten oxide nanoparticle films as a catalytic active material ("a catalyst"). Further uses include the use in electrochromic applications; and/or thermochromic applications; and/or in sensor applications; and/or in a transistor; and/or in a varistor; and/or in a capacitor; and/or in thermoelectric applications.

In a second aspect, the invention relates to a process for manufacturing thin films of nanoparticles. These films have beneficial properties and have advantageous uses as outlined below. It was found that the inventive films (i) are obtainable by a solution process; (ii) are essentially free of (or free of) residual organic materials after drying at a temperature below 150° C.; (iii) are thin (below 200 nm) (iv) have a low final surface roughness (below 100 nm). This aspect of the invention shall be explained in further detail below.

In one embodiment, the invention provides a method for manufacturing a thin film, comprising the steps of (a) applying a composition as described herein (i.e. type (A), (B) and (C) and (D)) on a substrate or coated substrate and (b) removing the solvent from said composition and optionally (c) treating the dried films at elevated temperature.

Step (a) Application of a suspension: Many processes are known to apply a liquid composition to a substrate to result in a wet thin film; a person skilled in the art is in a position to appropriately select. Suitable are, for example roll-to-roll coating, slot-die coating, spray coating, dip coating, ink-jet printing, reel-to-reel coating, pad printing, offset printing, screen printing, sheet-to-sheet printing or blade coating. Such processes are generally considered advantageous for large scale production, when compared to vacuum-based processes. Depending on the composition used in step (a), this step may be repeated (i.e. may be performed multiple times). This embodiment is considered advantageous in order to fine tune the final film thickness.

Step (b) Drying and film formation: Many processes are known to remove a liquid from a wet thin film of a coated substrate; a person skilled in the art is in a position to appropriately select. Suitable are, for example drying at room temperature or elevated temperature. Drying may take place in air, in a protecting gas, such as nitrogen or argon. Especially suited are gases with low humidity content (e.g. N2, dry air, Ar).

Step (c) Temperature cleaning step: In order to minimize residual organics (especially physically adsorbed organic solvent molecules) from dried nanoparticle films, a cleaning step in the form of a temperature annealing can optionally be conducted at temperatures below 150° C.

Many processes are known for the annealing of coated substrates. Suitable are, for example annealing at elevated temperature at ambient conditions (pressure, atmosphere). In order to minimize residual organic solvent molecules from deposited tungsten oxide films, the annealing step is preferably conducted at a temperature above the highest boiling point with respect to all organic solvents in a suspension composition. In order to minimize the water content, an annealing step above 100° C. is preferred. The maximum annealing temperature is typically below 150° C. and is only limited by the temperature sensitivity of the substrate. The annealing step can be conducted in oxygen, air or in an oxygen-free atmosphere ("protecting gas", e.g. N2 or Ar).

Advantageously, the invention relates to a method as described herein, wherein said film has a thickness between 5-200 nm, preferably 10-150 nm (determined by electron microscopy).

Advantageously, the invention relates to a method as described herein, wherein said film has a mean surface roughness below 100 nm, especially below 50 nm (determined by electron microscopy, atomic force microscopy or profilometry).

Advantageously, the invention relates to a method as described herein, wherein said film has an electrical conductivity of $10^{(-6)}-10^{(4)}$ S/cm, preferably $10^{(-4)}-10^{(2)}$ S/cm (determined by 4-point conductivity measurement).

Advantageously, the substrate referred to above is a hydro-phobic organic substrate, preferably a substrate with a surface free energy below 40 mJ/m$^2$, particularly preferably below 30 mJ/m$^2$. Such substrates may be uncoated or coated and include organic active layers ((2) in FIG. 2) as defined above.

Depending on the composition used in step (a) and/or the removing step (b) and/or step (c), these thin films are either known or novel.

Thus, the invention provides for an alternative manufacturing method of thin films, this method being advantageous over the known methods. For example, there is no need for a plasma-cleaning step of the as-deposited films (e.g. by ozone). Further, the thin film produced according to this embodiment, allows a defect-free production, particularly when deposited on hydrophobic substrates. Further, the thin film produced according to this embodiment, shows <2.5 wt %, particularly <1 wt %, residual organic carbon content when dried at temperatures below 150° C.

The invention also provides for new films, being subject of the present invention. Such new thin films are characterized by one or more of the following parameters (i) being essentially free of (or free of) residual organic materials after drying at a temperature below 150° C.; (ii) having a thickness below 200 nm (iv) having a final surface roughness below 100 nm; and/or (iv) consist of nanoparticles obtained by a gas phase process.

The invention further provides for a process of manufacturing organic electronics and electrical intermediates (both as defined herein), said process comprising the steps of providing a substrate; performing steps (a) and (b) and optionally (c) (as defined above); and optionally performing further coating steps. Due to the beneficial properties of the thin film (as defined herein), there is no need of performing plasma-cleaning (e.g. ozone plasma) after step (b) or (c) respectively. Thus, the invention also provides for a process of manufacturing organic electronics and electrical intermediates, said process comprising the steps of providing a substrate; performing steps (a),(b) and/or (c); and optionally performing further coating steps, wherein no plasma-cleaning takes place after step (b) or (c) respectively.

The invention further provides for a process of manufacturing organic electronics and electrical intermediates (both as defined herein), by solution processing. The term "solution-processing" is known in the field and denotes the application of a coating or thin film to a substrate by the use of a solution-based (=liquid) starting material. In the context of the present invention, solution processing relates to the fabrication of organic electronics and electrical intermediates comprising thin nanoparticle films by the use of one or more liquid suspensions, characterized in that the application of the suspension(s) is/are conducted preferably at ambient pressure.

In a third aspect, the invention relates to an electrical element (intermediate, INT), comprising one or more, preferably one, thin film as described herein or obtained by a method as described herein. Further, the invention relates to a device comprising one or more of such elements. This aspect of the invention shall be explained in further detail below.

The terms "organic electronics", "OLED", "OPV" are known in the field and relate to electronic devices comprising a substrate and a multitude of layers, wherein at least one layer is a buffer layer, particularly a hole transport layer (HTL). Depending on the remaining layers, its structure and connection, these devices serve a multitude of purposes, such as an OLED, an OPV, an organic photo detector or a tandem solar cell.

The term "buffer layer" is known in the field and denotes an interface layer in electronic devices, typically in OPV or OLED devices. The term buffer layer includes both, electron selective buffer layers and hole selective buffer layers. Buffer layer, also denoted 'charge selective layer' or 'charge transport layer', is the general term for layers with different electronic functions and particularly includes hole transport layers (HTL), hole injection layers (HIL), hole extraction layers (HEL), electron transport layers (ETL), electron injection layers (EIL) or electron extraction layers (EEL).

In one embodiment, the invention relates to a device comprising one or more electrical elements as described herein, preferably selected from the group of organic electronics, particularly an organic solar cell (OPV), an organic light emitting diode (OLED), an organic photo detector or a tandem solar cell.

In one embodiment, the invention relates to an OLED wherein the HTL (i) is obtained by a method as described herein or (ii) consists of a thin layer as described herein. In this embodiment, the OLED preferably comprises a substrate selected from the group of organic polymers.

In a further embodiment, the invention relates to an organic solar cell (OPV) wherein the HTL (i) is obtained by a method as described herein or (ii) consists of a thin layer as described herein. In this embodiment, the OPV preferably comprises a substrate selected from the group of organic polymers, metals or oxides.

In a further embodiment, the invention relates to an OPV or OLED device where the hole transport layer is applied between the anode and the organic active layer (inverted architecture).

In a further embodiment, the invention relates to an OPV or OLED device where the hole transport layer is applied between the cathode and the organic layer.

In a further embodiment, the invention relates to an OPV device with tandem architecture.

In a fourth aspect, the invention relates to a method for manufacturing a composition as described herein. This aspect shall be explained in further detail below.

In one embodiment, the invention relates to a method for manufacturing a composition as described herein (c.f. FIG. 1), comprising the steps of (a) providing a homogeneous solvent composition (S.M.), (b) providing nanoparticles (S.M), (c) combining said nanoparticles with said homogeneous solvent composition to obtain a suspension (COMP.).

To further illustrate the invention, the following examples are provided. These examples are provided with no intent to limit the scope of the invention.

Starting Materials: Tungsten oxide nanoparticles with a nominal composition of $WO_3$ were synthesized by flame spray synthesis. For the preparation of the precursor, 42 g of sodium metatungstate (Fluka) was dissolved in 750 g distilled water and 75 g acetic acid. After adding 225 g aniline the solution was manually shaken for 3 min and washed three times with water in order to remove sodium and acetic acid. The obtained solution was diluted with THF 1:2 by weight. The precursor then was fed (5 ml min$^{-1}$, HNP Mikrosysteme, micro annular gear pump mzr-2900) to a spray nozzle, dispersed by oxygen (7 l min$^{-1}$, PanGas tech.) and ignited by a premixed methane-oxygen flame ($CH_4$:1.2 l min$^{-1}$, $O_2$:2.2 l min$^{-1}$). The off-gas was filtered through a glass fiber filter (Schleicher & Schuell) by a vacuum pump (Busch, Seco SV1040CV) at about 20 m$^3$ h$^{-1}$. The obtained tungsten oxide nanopowder was collected from the glass fiber filter.

EXAMPLE 1

For the preparation of the tungsten oxide suspension 2 wt % of tungsten oxide nanopowder (as described above) was dispersed by ball-milling for 60 min in a mixture of 2 wt % distilled water and 96 wt % dry ethanol. The finally prepared suspension is transparent and stable for more than 3 months. After 3 months, the hydrodynamic particle size ($D_{99}$) was determined as 37 nm (measured by a centrifugal particle sizer (Lumisizer)).

Tungsten oxide nanoparticle films were spin-coated on HDPE and PVC foils under nitrogen resulting in homogeneous and defect-free tungsten oxide films. The thickness of the deposited tungsten oxide films was determined as ~50 nm by scanning electron microscopy (SEM). The surface roughness was estimated to be in the range of 5-10 nm (SEM). Annealing of the obtained films for 30 min at 130° C. in air resulted in a residual organic carbon content (microanalysis) of 0.5 wt %.

EXAMPLE 2

A stabilized tungsten oxide suspension was obtained by dispersing 2 wt % of tungsten oxide (as described above) in a mixture of 95 wt % dry isopropanol and 3 wt % of distilled water without further addition of an organic surfactant or dispersing agent. After 3 months, the hydrodynamic particle size ($D_{99}$) was determined as 32 nm (measured by a centrifugal particle sizer (Lumisizer)).

After suspension application the coated material is dried under nitrogen at room temperature and ambient pressure. During drying, an azeotropic water/isopropanol mixture (12.1 wt % water, 87.9 wt % isopropanol) evaporates first, leaving back isopropanol and tungsten oxide. (isopropanol prevents de-wetting of the still wet film composed of isopropanol and tungsten oxide.)

Next, isopropanol evaporates prior leaving a dry film of tungsten oxide, tungsten oxide and water-free isopropanol is not a stable suspension system, but the film drying at this stage is almost complete and tungsten oxide has no time to form loose agglomerates. As a result, a defect-free thin film with a thickness below 200 nm and a surface roughness below 100 nm is obtained, essentially free of residual organic materials.

EXAMPLE 3

According to ex. 1 and 2, the following examples are prepared using the respective staring materials, hereby examples in italics are for comparative purposes.

| Experiment | Organic solvent | Tungsten oxide nanoparticles (wt %) | H2O (wt %) | Organic solvent (wt %) | Is amount of water < total azeotropic water content? | Film formation HDPE (##) | Film formation PVC (##) | Suspension stability (#) |
|---|---|---|---|---|---|---|---|---|
| 1 | *Methanol* | 4 | 6 | 90 | *no azeotrope* | -- | -- | + |
| 2 | *Methanol* | 5 | 45 | 50 | *no azeotrope* | -- | -- | ++ |
| 3 | *Ethanol* | 2 | 0 | 98 | *no water* | -- | -- | -- |
| 4 | Ethanol | 2 | 3 | 95 | yes | ++ | ++ | ++ |
| 5 | Ethanol | 3 | 2 | 95 | yes | ++ | ++ | ++ |
| 6 | *Ethanol* | 4 | 6 | 90 | *no* | -- | -- | + |
| 7 | *Ethanol* | 2 | 8 | 90 | *no* | -- | -- | + |
| 8 | *2-Propanol* | 1 | 0 | 99 | *no water* | -- | -- | -- |
| 9 | 2-Propanol | 0.6 | 2.4 | 97 | yes | ++ | ++ | ++ |
| 10 | 2-Propanol | 2 | 8 | 90 | yes | ++ | ++ | ++ |
| 11 | 2-Propanol | 4 | 6 | 90 | yes | ++ | ++ | ++ |
| 12 | *2-Propanol* | 4 | 16 | 80 | *no* | -- | -- | - |
| 13 | *2-Propanol* | 2 | 23 | 75 | *no* | -- | -- | - |
| 14 | 1-Propanol | 4 | 6 | 90 | yes | ++ | ++ | ++ |
| 15 | *1-Propanol* | 2 | 49 | 49 | *no* | -- | -- | -- |
| 16 | 1-Butanol | 4 | 6 | 90 | yes | ++ | ++ | + |
| 17 | 2-Butanol | 2 | 3 | 95 | yes | ++ | ++ | ++ |
| 18 | tert-Butanol | 2 | 3 | 95 | yes | ++ | ++ | + |
| 19 | *1-Pentanol* | 2 | 5 | 93 | *yes* | 0 | 0 | - |
| 20 | *1-Hexanol* | 2 | 3 | 95 | *yes* | 0 | 0 | -- |
| 21 | *Cyclo hexanol* | 1 | 10 | 89 | *yes* | -- | 0 | -- |
| 22 | *2-Methoxy-ethanol* | 4 | 6 | 90 | *yes* | -- | -- | -- |

-continued

| Experiment | Organic solvent | Tungsten oxide nanoparticles (wt %) | H2O (wt %) | Organic solvent (wt %) | Is amount of water < total azeotropic water content? | Film formation HDPE (##) | Film formation PVC (##) | Suspension stability (#) |
|---|---|---|---|---|---|---|---|---|
| 23 | 2-Ethoxy-ethanol | 2 | 3 | 95 | yes | 0 | 0 | − |
| 24 | Aceto-nitrile | 4 | 6 | 90 | yes | −− | ++ | + |
| 25 | Propio-nitrile | 1 | 4 | 95 | yes | ++ | ++ | + |
| 26 | (2,2,2)-Tri-fluoroethanol | 2 | 4 | 94 | no azeotrope | −− | −− | + |
| 27 | Ethanol/MEK | 2 | 6 | 15/77 | yes | ++ | ++ | + |
| 28 | 1-Propanol/Methanol | 5 | 7 | 35/53 | yes | ++ | ++ | ++ |

In the experiments of example 3, suspension stability is measured at ambient conditions, whereby the suspension stability is denoted "−−" if more than 10% of tungsten oxide is sedimented between 0 and 1 day, "−" if more than 10% is sedimented between 1 day and 1 week, "+" if more than 10% is sedimented between 1 week and 2 months, "++" if less than 10% is sedimented after 2 months In the experiments of example 3, film formation is measured under nitrogen, room temperature and ambient pressure on HDPE foils and PVC foils, whereby the tests were performed 1-24 h after suspension preparation, whereby: "−−"=de-wetting; "0"=film formation with defects; "++"=film formation without defects.

From the data obtained, it is concluded that the suspensions disclosed, particularly according to experiments 4, 5, 9-11, 14, 16-18, 25, 27-28, show good wettability on hydrophobic substrates with surface energies below 30 mJ/m$^2$ and superior stability.

EXAMPLE 4

[Application and further processing of the thin films] The films obtained according to experiments 4,5,9-11,14 16-18, 25,27,28 (in example 3) are obtained by doctor-blading the corresponding suspensions in nitrogen on HDPE and PVC substrates. Drying of the wet was conducted for 5 min under nitrogen at room temperature and ambient pressure. The thus obtained films have a thickness of 50-100 nm, are defect free and exhibit a surface roughness below 50 nm (all as determined by electron microscopy).

Further, after an annealing step for 30 min at 130° C. in air, the thus obtained films have a residual organic carbon content of less than 1 wt % within the film.

For these dried films, further processing (i.e. application of additional layers to obtain organic electronics) is additional possible without further purification. Thus, no additional plasma-cleaning step—such as ozone treatment—of the as-deposited filmis required.

The invention claimed is:

1. A composition in the form of a suspension, said composition containing
(a) tungsten oxide nanoparticles selected from the group consisting of
  nanoparticles of pure tungsten oxide,
  nanoparticles of doped tungsten oxide, and
  core-shell nanoparticles, whereby the shell is composed of tungsten oxide or doped tungsten oxide and the core is composed of a different inorganic material;
(b) a homogeneous solvent composition comprising water,
a first organic solvent forming a binary azeotrope with water;
whereby the amount of water in said solvent composition (b) is below the total azeotropic water content with respect to said first organic solvent;
whereby the ratio amount of nanoparticles: amount of water is below 9:1 (w/w), and the amount of water in the composition is in the range of 0.1-20 wt %; and
wherein the composition is free of surfactants and dispersing agents.

2. The composition of claim 1, wherein said homogeneous solvent composition (b) additionally comprises a second organic solvent forming a binary azeotrope with water,
whereby the amount of water in said solvent composition (b) is below the total azeotropic water content with respect to said first and said second organic solvent.

3. The composition of claim 1, wherein said homogeneous solvent composition (b) additionally comprises a third organic solvent not forming a binary azeotrope with water.

4. The composition of claim 1, consisting of

| (a) wt % | Water wt % | 1$^{st}$ organic solvent wt % | |
|---|---|---|---|
| 0.2-4 | 0.2-4 | 92-99.6 ethanol | or |
| 0.2-10 | 0.2-10 | 80-99.6 2-propanol | or |
| 0.2-20 | 0.2-20 | 60-99.6 1-propanol | or |
| 0.2-16 | 0.2-16 | 68-99.6 1-butanol | or |
| 0.2-20 | 0.2-20 | 60-99.6 2-butanol | or |
| 0.2-10 | 0.2-10 | 80-99.6 tert-butanol | or |
| 0.2-13 | 0.2-13 | 74-99.6 acetonitrile | or |
| 0.2-4 | 0.2-4 | 92-99.6 propionitrile | . |

5. The composition of claim 1, wherein
said first organic solvent is selected from the group consisting of alcohols and nitriles;
said second organic solvent is selected from the group consisting of alcohols, nitriles, ketones, esters, ethers, aldehydes and alkoxy-alcohols;
said third organic solvent is selected from the group consisting of alcohols, nitriles, ketones, esters, ethers, aldehydes and alkoxy-alcohols;
and whereby said alcohols may be partly or fully substituted with halogen,
and whereby said alcohols may contain multiple bonds,
and whereby said organic solvents may include linear, branched or cyclic derivatives.

6. The composition of claim 1, wherein the amount of nanoparticles is in the range of 0.1-20 wt % and the amount of homogeneous solvent composition is in the range of 80-99.9 wt %.

7. A method for manufacturing the composition according to claim 1, comprising the steps of
    (a) providing the homogeneous solvent composition;
    (b) providing nanoparticles;
    (c) combining said nanoparticles with said homogeneous solvent composition to obtain the suspension.

8. The composition of claim 2, consisting of:
   2-10 wt % of the tungsten oxide nanoparticles (a);
   2-10 wt % water; and
   0.6-80 wt % 1-propanol/0.5-99 wt% methanol as $1^{st}/2^{nd}$ organic solvent.

* * * * *